(12) United States Patent
Miyagawa et al.

(10) Patent No.: US 7,655,579 B2
(45) Date of Patent: Feb. 2, 2010

(54) METHOD FOR IMPROVING HEAT TRANSFER OF A FOCUS RING TO A TARGET SUBSTRATE MOUNTING DEVICE

(75) Inventors: Masaaki Miyagawa, Nirasaki (JP); Akihiro Yoshimura, Nirasaka (JP)

(73) Assignee: Tokyo Electron Limited, Tokyo (JP)

( * ) Notice: Subject to any disclaimer, the term of this patent is extended or adjusted under 35 U.S.C. 154(b) by 52 days.

(21) Appl. No.: 11/970,612

(22) Filed: Jan. 8, 2008

(65) Prior Publication Data
US 2008/0166894 A1  Jul. 10, 2008

Related U.S. Application Data

(60) Provisional application No. 60/912,935, filed on Apr. 20, 2007.

(30) Foreign Application Priority Data

Jan. 9, 2007  (JP)  ............... 2007-001809

(51) Int. Cl.
*H01L 21/00* (2006.01)
(52) U.S. Cl. ............ 438/798; 156/345.47; 156/345.52; 156/345.53; 257/E21.001
(58) Field of Classification Search ............ 156/435.37, 156/345.52, 345.53; 438/798
See application file for complete search history.

(56) References Cited

U.S. PATENT DOCUMENTS

| | | | | |
|---|---|---|---|---|
| 5,255,445 A | * | 10/1993 | Li et al. | ............... 34/443 |
| 5,683,744 A | * | 11/1997 | Jolly et al. | ............... 427/121 |
| 5,978,202 A | * | 11/1999 | Wadensweiler et al. | ..... 361/234 |
| 6,723,202 B2 | * | 4/2004 | Nagaiwa et al. | ........ 156/345.43 |
| 6,733,624 B2 | | 5/2004 | Koshiishi et al. | |

\* cited by examiner

*Primary Examiner*—Charles D Garber
*Assistant Examiner*—Yasser A Abdelaziez
(74) *Attorney, Agent, or Firm*—Oblon, Spivak, McClelland, Maier & Neustadt, L.L.P.

(57) ABSTRACT

A focus ring heat transfer method improves heat transfer of a focus ring arranged in an outer peripheral portion of a mounting surface of a mounting table adapted to mount a target substrate in a chamber. The method includes steps of: disposing a heat transfer sheet between the focus ring and the mounting table; and vacuum-evacuating the chamber prior to processing the target substrate and then restoring the pressure the inside of the chamber to an atmospheric pressure or a light vacuum pressure. Therefore, air present in a fine gap between the heat transfer sheet and the mounting surface is removed to allow the heat transfer sheet to adhere to the mounting surface.

5 Claims, 4 Drawing Sheets

ATMOSPHERIC PRESSURE

TENS OF TORR

SEVERAL TORR ~ 1TORR OR LESS

PRESSURE RESTORATION

ATMOSPHERIC PRESSURE

TENS OF TORR

SEVERAL TORR

1TORR OR LESS

METHOD FOR IMPROVING HEAT TRANSFER OF A FOCUS RING TO A TARGET SUBSTRATE MOUNTING DEVICE

FIELD OF THE INVENTION

The present invention relates to an operation method of a target substrate mounting device for use in a plasma processing or the like and, more particularly, to a focus ring heat transfer improvement method for improving heat transfer between a mounting table for mounting a target substrate and a focus ring arranged in an outer peripheral portion of a mounting surface of the mounting table.

BACKGROUND OF THE INVENTION

Plasma processing is widely used in semiconductor manufacturing apparatuses, e.g., a surface treating apparatus and an etching apparatus. In the plasma processing, a substrate mounting device for mounting a target substrate such as a wafer or the like is provided within a processing chamber. The substrate mounting device includes, e.g., as shown in FIG. 5, a mounting table (wafer chuck) 2 for mounting a wafer 1 and a focus ring 3 arranged in an outer peripheral portion of the mounting table 2. An electrostatic chuck is commonly used as the wafer chuck.

When the wafer 1 is plasma processed in a processing chamber, the wafer 1 is placed on the wafer chuck 2 and then is fixed in place while the processing chamber is kept at a predetermined vacuum level (in case of using, e.g., an electrostatic chuck, the wafer is electrostatically attracted thereto by applying a DC voltage to a dielectric member of a mounting surface). Then, a high frequency voltage is applied to the wafer chuck 2 to generate a plasma in the processing chamber.

Since the temperature of the wafer 1 is increased by the plasma processing, the wafer 1 is cooled to maintain at a desired temperature by means of a cooling mechanism provided in the wafer chuck 2. In this process, a frequently applied method is to increase the heat conduction rate between the wafer 1 and the wafer chuck 2, wherein a helium gas of high heat conductivity is allowed to flow from the top surface of the wafer chuck toward the rear surface of the wafer 1.

In this regard, the focus ring 3 may be provided to reduce the discontinuity in the plasma in the outer peripheral portion of the target substrate, so that uniformity in the plasma processing over the entire surface of the target substrate is improved (see, e.g., Japanese Patent Laid-open Application Nos. 2002-016126, 2002-033376 and 2006-220461).

Since the conventional target substrate mounting device is of a structure wherein the focus ring 3 is merely placed on the wafer chuck 2, micro-sized fine gaps are formed between the wafer chuck 2 and the focus ring 3. Thus, the focus ring 3 fails to make a perfectly tight contact with the wafer chuck 2 to thereby allow air to be left in the fine gaps, causing that the focus ring 3 cannot be sufficiently cooled.

In other words, although the portion of the wafer other than the peripheral portion is sufficiently cooled by the cooling effect of the cooling mechanism and the helium gas, the temperature of the focus ring 3 is increased in the outer peripheral portion of the wafer. And then, the heat of the focus ring is transferred to the outer peripheral portion of the wafer to thereby increase the temperature of thereof. The etching property of the outer peripheral portion of the wafer becomes worsened by the influence of the increased temperature. This causes a problem in that the release property of etching openings (the properties with which the wafer can be reliably etched into a specified depth in the etching process) is deteriorated and the aspect ratio of the etching is decreased.

As a countermeasure for preventing the temperature increase in the focus ring, JP2002-16126A discloses a target object mounting device in which a heat transfer medium is interposed between a mounting table and a focus ring, wherein the target object mounting device includes a pressing means for pressing and fixing the focus ring to the mounting table. JP2002-33376A discloses a target object mounting device that includes an electrostatic adsorption means for attracting a focus ring.

However, the target object mounting devices disclosed in the above patent documents need to be provided with a drive mechanism for physically pressing the focus ring against the mounting table or an electrode for electrostatically to the focus ring. This is problematic in that the mounting devices become structurally complicated and suffer from increased installation costs. Another problem is that the drive mechanism and the electrode for electrostatic adsorption may cause abnormal plasma discharge and generate particles or dust.

SUMMARY OF THE INVENTION

The present invention provides a method that can increase the adhesity between a focus ring and a wafer chuck and can easily enhance the heat conductivity between the focus ring and a substrate mounting device, without employing a drive device for pressing the focus ring or an electrode for electrostatic adsorption.

In accordance with an aspect of the present invention, there is provided a focus ring heat transfer improvement method for improving heat transfer of a focus ring arranged in an outer peripheral portion of a mounting surface of a mounting table, the mounting table adapted to mount a target substrate in a chamber, including: disposing a heat transfer sheet between the focus ring and the mounting table and vacuum-evacuating the chamber prior to processing the target substrate; and then restoring the pressure of the inside of the chamber to an atmospheric pressure or a light vacuum pressure, whereby air present in a fine gap between the heat transfer sheet and the mounting surface is removed to allow the heat transfer sheet to adhere to the mounting surface.

With the above method, the pressure restoration step is performed after removing the air from a gap in the vacuum evacuation step, whereby the flexible heat transfer sheet is firmly pressed and adhered to a solid body surface adjoining thereto. Then, the air is prevented from infiltrating into the gap between the contact surfaces. This removes the heat transfer resistance which would otherwise be generated in the air layer between the contact surfaces, thereby greatly increasing the heat emitted from the focus ring.

In the above method, it is preferred that the vacuum evacuation step and the subsequent pressure restoration step are repeatedly performed plural times. As can be seen in the test examples, the heat emission from the focus ring is improved more greatly when repeating the vacuum evacuation step and the subsequent pressure restoration step two times than when performing them one time.

In the above vacuum evacuation step, the vacuum level within the processing chamber may be one Torr or less.

Preferably, the heat transfer sheet employed in the present invention is made of a flexible high molecular material. In particular, it is preferred that the heat transfer sheet is a sheet made of or containing gel-like polymer and further that the ratio of the hardness represented in terms of ASKER C to the heat transfer rate represented in terms of W/m·K is smaller than 20 in the sheet. Although it is preferred that the heat transfer sheet has flexibility and heat conductivity in combination, use of a heat transfer sheet having increased heat conductivity is particularly important.

The heat transfer sheet may be of a thickness of 0.2 to 1 mm. If the thickness of the heat transfer sheet is thinner than 0.2 mm, it becomes difficult to remove the heat transfer sheet after using the same. If the thickness of the heat transfer sheet exceeds 1 mm, it is likely that the etching properties of the peripheral portion of the wafer are adversely affected during the plasma processing.

In accordance with the present invention, it becomes possible to increase the adhesity between a focus ring and a wafer chuck without employing a drive device for pressing the focus ring or an electrode for electrostatic adsorption. In other words, the heat transfer resistance caused by an air layer can be greatly reduced by maintaining a state that the residual air is removed from the contact surfaces of the focus ring and the wafer chuck. This makes it possible to improve the heat transfer of the focus ring with ease but without applying a particularly designed mechanical means.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENTS

Figure 1:
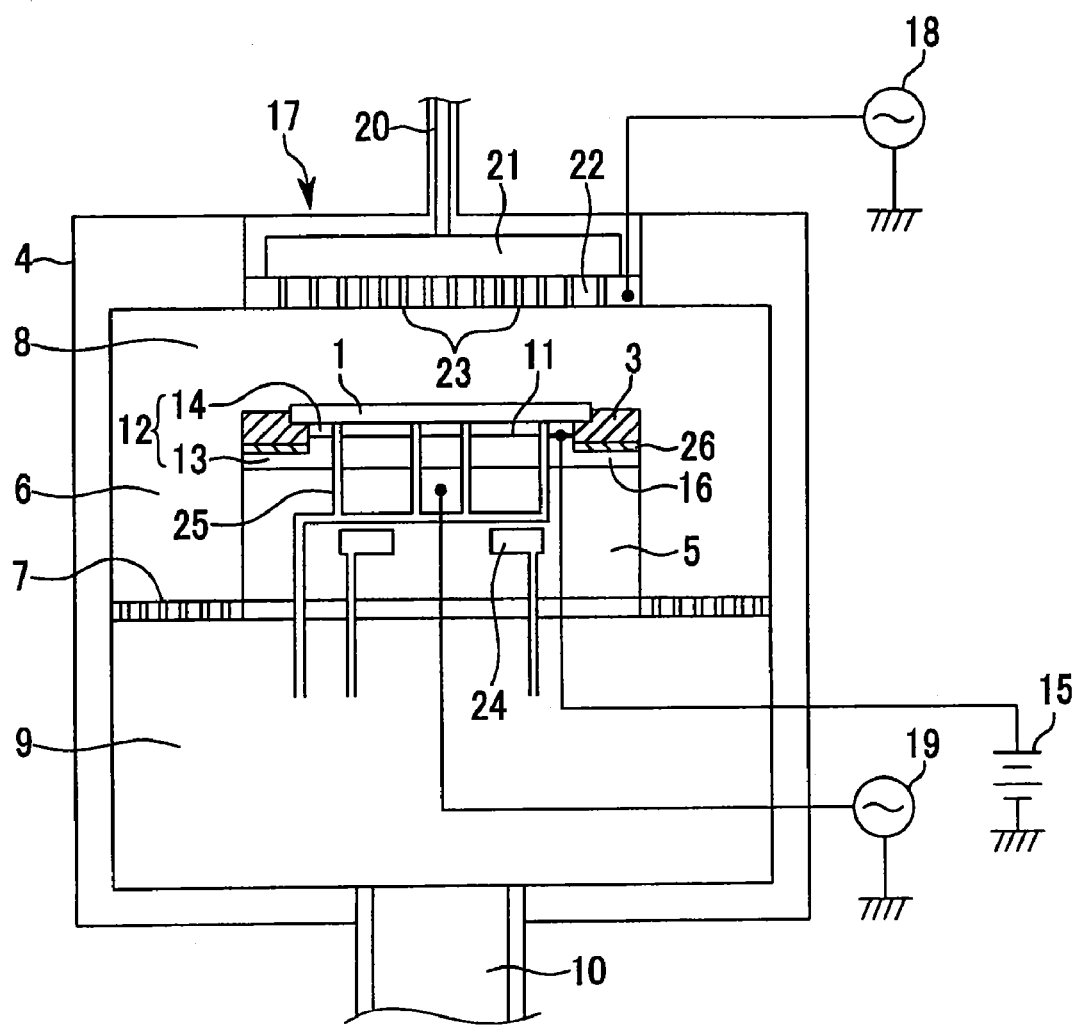
FIG. 1 is a schematic cross sectional view showing one example of plasma processing apparatus used in embodying the present invention.

Hereinafter, embodiments of the present invention will be described with reference to the accompanying drawings that form a part hereof. In the drawings, like parts are designated by like reference numerals.

First, an apparatus used in the present invention will be described. FIG. 1 is a schematic cross sectional view showing a plasma processing apparatus used in embodying the present invention. The plasma processing apparatus includes a chamber 4 for accommodating a wafer 1. A cylindrical susceptor 5 as a mounting table for mounting the wafer 1 is arranged in the chamber 4.

A side exhaust path 6 for discharging gas is formed between an inner wall surface of the chamber 4 and a side surface of the susceptor 5. An exhaust plate 7 made of a porous plate is arranged at midway of the side exhaust path 6. The exhaust plate 7 serves as a partition plate that divides the chamber 4 into upper and lower parts. The upper part of the chamber 4 above the exhaust plate 7 is a reaction room 8, while the lower part of the chamber 4 below the exhaust plate 7 is an exhaust room 9. An exhaust line 10 is opened to the exhaust room 9 so that the chamber 4 can be vacuum-evacuated by a vacuum pump (not shown).

An electrostatic chuck 12 having an electrostatic electrode plate 11 provided inside thereof is arranged on the susceptor 5. The electrostatic chuck 12 is formed with a lower disc-shaped member 13 having an upper disc-shaped member 14 of a smaller diameter than that of the lower disc-shaped member 13 overlapped thereon. The top surface of the upper disc-shaped member 14 is formed of a dielectric (ceramic or the like) layer and the electrostatic electrode plate 11 is connected to a DC power supply 15. Therefore, by applying a high DC voltage to the electrostatic electrode plate 11, a dielectric potential is generated on the surface of the upper disc-shaped member 14, whereby the wafer 1 placed on the upper disc-shaped member 14 is attractively held by the Coulomb force or the Johnson-Rabeck force.

The lower disc-shaped member 13 is configured in that a brim (annular seat portion) 16 is outwardly extended from the peripheral portion of a central cylindrical part of the lower disc-shaped member 13, and a focus ring 3 is mounted on the brim 16. The focus ring 3 is made of a conductive material, e.g., silicon or silicon carbide. The focus ring 3 is designed to cover the outer side of the wafer 1 and the surface thereof is exposed to the space of the reaction room 8. The focus ring 3 serves to converge the plasma generated within the reaction room 8 on the wafer 1.

The plasma is generated within the reaction room 8 by a high frequency electric power applied from an upper RF power supply 18 to a gas inlet shower head 17 provided at the upper portion of the reaction room 8 and a high frequency power applied from a lower RF power supply 19 to the susceptor 5. A reaction gas is supplied from a gas inlet line 20 to the gas inlet shower head 17. As the reaction gas flows through a buffer room 21 and passes through a multiplicity of gas passage holes 23 provided in an upper electrode plate 22, the reaction gas is converted into a plasma to be supplied into the reaction room 8.

The wafer 1 is heated by being exposed to the plasma of high temperature and is cooled by heat transfer to the susceptor 5. In view of this, the susceptor 5 is made of a metallic material exhibiting good heat conductivity and is internally provided with a coolant path 24 through which coolant such as water or ethylene glycol is circulated to cool the susceptor 5. In the surface of the susceptor 5 that attracts and holds the wafer 1, there is provided a multiplicity of heat-transferring gas supply openings 25 through which a helium gas is effused to cool the rear surface of the wafer 1.

In the meantime, the focus ring 3 is also heated by being exposed to the plasma. The heat of the focus ring 3 is transferred to the susceptor 5 through the lower disc-shaped member 13 so that the focus ring 3 can be cooled. However, if the adhesion between the focus ring 3 and the lower disc-shaped member 13 is insufficient, there occurs a problem in that the heat transfer resistance becomes great therebetween. In other words, there remains air in the fine gap formed between the contact surfaces of the focus ring 3 and the lower disc-shaped member 13 and the air becomes a main source for the heat transfer resistance. For this reason, the temperature of the focus ring 3 becomes several tens degrees higher than the temperature of the wafer 1, thereby deteriorating the etching properties of the peripheral portion of the wafer 1.

One way for improving the heat transfer resistance between the focus ring 3 and the lower disc-shaped member 13 is to interpose a thin heat transfer sheet 26 between them, wherein the heat transfer sheet 26 is made of a high molecular material exhibiting relatively high heat conductivity and having flexibility. As the heat transfer sheet proposed by the present inventors in JP2006-188262A may be used as such a heat transfer sheet.

The heat transfer sheet is either a sheet made of gel-like polymer or a sheet made by impregnating a polymer sheet (e.g., a foamed resin sheet) with gel-like polymer (if necessary, a filling material may be added to the gel-like polymer), in which case the polymer sheet serves as a skeleton material. The heat transfer sheet of this type is characterized with high flexibility and heat conductivity. As for the physical properties of the heat transfer sheet, it is preferred that the ratio (H/k) of the hardness (H) represented in terms of ASKER C to the heat transfer rate (k) represented in terms of W/m·K is smaller than 20, with the heat transfer rate (k) kept high.

Use of this heat transfer sheet helps to increase the adhesion between the focus ring 3 and the heat transfer sheet 26 and the adhesion between the heat transfer sheet 26 and the lower disc-shaped member 13, whereby it is possible to reduce the heat transfer resistance. Further, the heat transfer resistance of the heat transfer sheet 26 can be reduced per se to a negligible level by using silicon gel with relatively good heat conductivity as the gel-like polymer and also by making the thickness of the sheet thin.

However, the results of investigation conducted by the present inventors reveal that, even when the heat transfer sheet is used, the air present in the fine gap between the boundary surfaces cannot be completely removed and still becomes a cause for high heat transfer resistance.

In view of this circumstance, the heat transfer improvement method of the present invention is characterized by including: a step of maintaining the chamber 4 at a predetermined vacuum level by use of a vacuum exhaust device of the processing apparatus as shown in FIG. 1 to thereby remove the residual air existing between the heat transfer sheet 26 and the focus ring 3; and a step of restoring the chamber 4 to an atmospheric pressure or a light vacuum pressure to enhance the adhesion between the focus ring 3, the heat transfer sheet 26, and the lower disc-shaped member 13.

Hereinafter, description will be made on the vacuum evacuation and pressure-restoration effect visually observed in a simulative experiment. The specimen used in the experiment was prepared by overlapping a heat transfer sheet on one side of a rectangular substrate plate (having a size of 200×200 mm) made of a material similar to the constituent material of the focus ring. A 0.5 mm-thick sheet made of "λGEL" (a registered trademark of Geltec Co., Ltd.) was used as the heat transfer sheet. A container accommodating the specimen was vacuum-evacuated and bleb generation statuses between the sheet and the plate were investigated.

FIGS. 2A through 2H are sketch diagrams illustrating examples of bleb generation statuses in the simulative experiment, in which diagrams are sectional views taken along the transverse center of the specimen. FIGS. 2A through 2D illustrate bleb generation statuses between the sheet and the plate when the internal pressures of the container are controlled to be an atmospheric pressure, a pressure of several tens Torr, a pressure in a range from several Torr to one Torr or less, and a restored pressure, respectively.

Figure 2A:
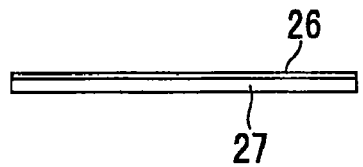
FIGS. 2A through 2H are sketch diagrams illustrating examples of bleb generation situations in a simulative experiment.
Figure 2B:
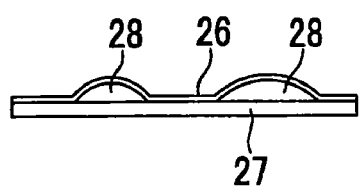
Figure 2C:
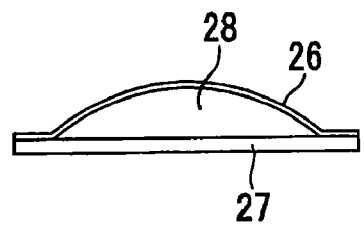
Figure 2D:
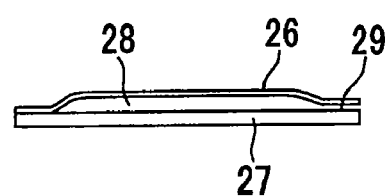
Figure 2E:
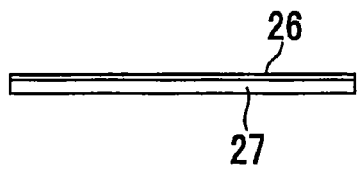
Figure 2F:
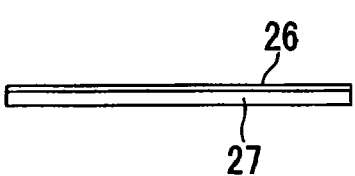
Figure 2G:
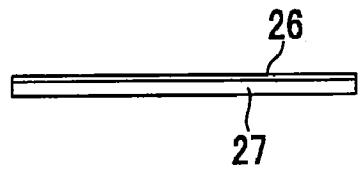

In the atmospheric pressure state illustrated in FIG. 2A, the substrate plate 27 and the heat transfer sheet 26 look apparently like as if they are in a close tight contact with each other, despite the fact that a micro-sized fine gap exists therebetween. If the internal pressure of the container is depressurized to several tens Torr, the residual air existing between the substrate plate 27 and the heat transfer sheet 26 is expanded as depicted in FIG. 2B, thus creating swollen portions 28. Under this pressure, the swollen portions 28 remain to be small as yet and merely scattered like islands. If the pressure is further depressurized to a range from several Torr to one Torr or less, the swollen portions 28 are combined together into a size great enough to cover most of the substrate plate. In this stage, the heat transfer sheet 26 is closely adhered to the substrate plate 27 in the peripheral portion of the latter such that there is no passageway formed for discharging the air contained in the swollen portion 28 to the external space. If the pressure starts to be restored from this state, a passageway 29 is formed in the edge of the substrate plate 27 as illustrated in FIG. 2D. Thus, the air contained in the swollen portion 28 is effused to the outside so that the swollen portion 28 can be reduced in size.

Figure 2H:
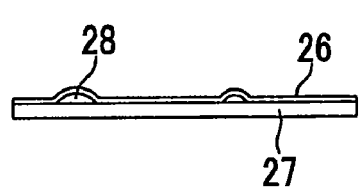

FIGS. 2E to 2H illustrate the statuses of the swollen portion when the container internal pressures are (restored to the atmospheric pressure (FIG. 2E) and then sequentially depressurized to several tens Torr, several Torr and one Torr or less. In case the pressure is several tens Torr (FIG. 2F) and several Torr (FIG. 2G), no swollen portions are generated by the expansion of the residual air. Small swollen portions begin to be generated only after the pressure has been depressurized to one Torr or less (FIG. 2H).

From the experimental results noted above, it can be first deduced that the pressure of the internal container is to be kept preferably equal to or less than one Torr to get rid of the remaining air. Secondly, it can be seen that the heat transfer sheet 26 is strongly pressed and adhered to the substrate plate 27 in the stage of restoring the pressure from the vacuum evacuation state to the atmospheric pressure and, therefore, little air is infiltrated into the gap between the heat transfer sheet 26 and the substrate plate 27. Once the vacuum evacuation and pressure restoration processing are performed, the heat transfer sheet 26 is closely adhered to the substrate plate 27 for a while, thereby making it possible to maintain a state in which no residual air exists between the heat transfer sheet 26 and the substrate plate 27. This means that the effect of the present invention is sustained for an extended period of time.

As will be apparent from the below-described embodiment, it is possible to improve the adhesity of the heat transfer sheet and to further enhance the effect of improving the heat transfer by repeating twice the vacuum evacuation and pressure restoration processing of the present invention, although it would be sufficiently effective to perform just once the vacuum-evacuation and pressure restoration processing.

However long the evacuation time is extended, the effect of improving heat transfer is not sufficiently attained merely by performing the vacuum evacuation. The pressure restoration step performed after the vacuum evacuation seems to be of paramount importance in assuring enhanced adhesity of the heat transfer sheet to the substrate plate. In the pressure restoration step, the pressure may be restored not only to an atmospheric pressure but also to a light vacuum pressure, e.g., a pressure in a range of about several hundreds to several tens Torr. It seems that an atmospherically acting pressure great enough to strongly press and adhere the heat transfer sheet to the underlying body may suffice.

Further, if the heat transfer sheet 26 is caused to adhere to the substrate plate 27 by performing once the vacuum evacuation step and the pressure restoration step prior to the first plasma processing, there is no need to carry out those steps each time the plasma processing is performed.

In the experimental examples set forth below, the effect of the present invention was investigated by measuring the temperature of the focus ring in case the method in accordance with the embodiment of the present invention was performed by using the plasma processing apparatus shown in FIG. 1 and the temperature of the focus ring when the prior art method was performed. The plasma processing was performed under such conditions:

Wafer diameter: 30 cm;

High frequency power for plasma generation: 5.7 kW (the total sum of the power generated by the upper and lower power supplies);

Plasma gas: a mixture $C_4F_8$, Ar and $O_2$; and

Flow rate of each gas: 30/450/50 CC/min.

Each measurement of the focus ring temperature was made in a state that a 0.5 mm-thick sheet made of "λGEL" (a registered trademark of Geltec Co., Ltd.) was interposed between the focus ring and the wafer chuck (the lower disc-shaped member).

The focus ring temperature was measured in accordance with an optical measuring method developed by the present inventors. The optical measuring method refers to a method of irradiating measurement light on a temperature-dependently displacing measurement object, measuring the displacement of the measurement object based on an interference waveform between the measurement light and the reference light and converting the displacement of the measurement object into a temperature (see JP2006-220461A for further details).

The plasma processing was performed for three minutes per wafer and the wafer was replaced at a time interval of 40 seconds. The temperature of the focus ring was repeatedly measured three times.

TEST EXAMPLE 1

Investigation as to whether the long-time vacuum evacuation was effective was conducted by measuring the temperature of the focus ring under the following three conditions.

Condition A: the vacuum evacuation step and the pressure restoration step were not performed (Comparative Example 1) and the experiment was conducted two times;

Condition B: the vacuum evacuation step (to one Torr or less) and the pressure restoration step were performed one time (Present Example 1) and the experiment was conducted two times; and Condition C: the vacuum evacuation step (to one Torr or less) and the pressure restoration step were performed two times (Present Example 2) and the experiment was conducted three times, three times of the repetitive experiment.

Figure 3:
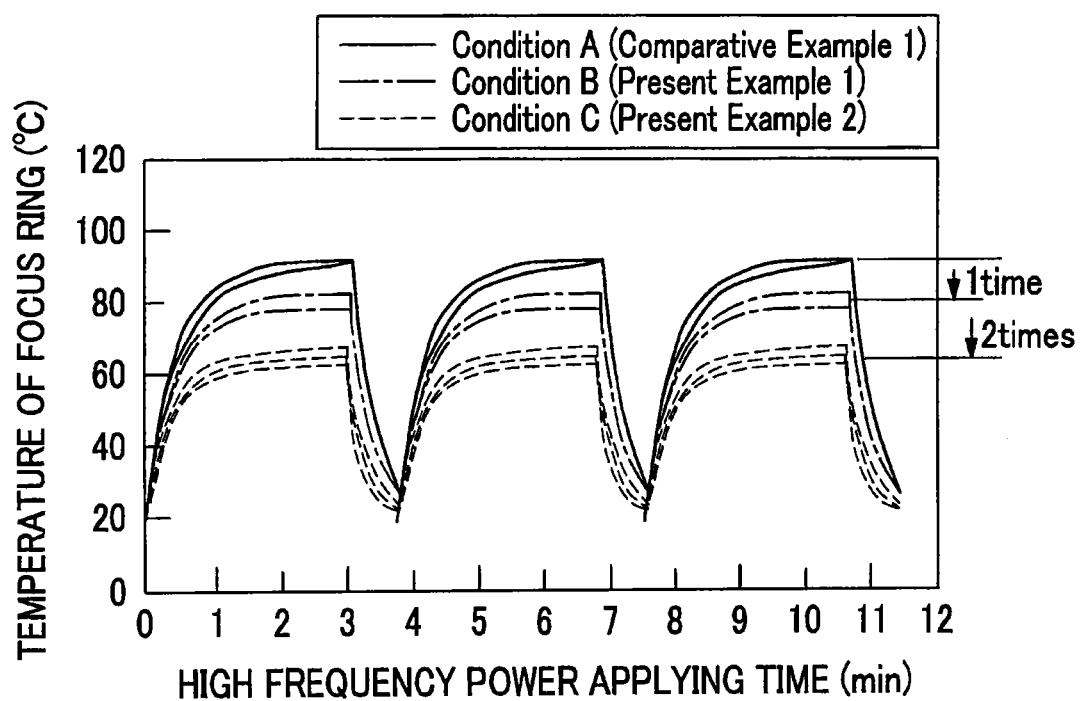
FIG. 3 is a view illustrating one example of measurement results of a focus ring temperature in accordance with an embodiment of the present invention.

The measurement results of focus ring temperature under these conditions are shown in FIG. 3. In each and every case, the temperature was sharply increased from the beginning of the plasma processing and a nearly constant temperature was reached within about one minute. After the plasma processing came to an end (when three minutes was lapsed), the temperature was rapidly decreased and returned to a nearly original temperature (the pre-processing temperature). The plasma processing was restarted after replacing the wafer at a time interval of 40 seconds. The temperature change was repeated three times in the same manner.

As can be seen in FIG. 3, the temperature of the focus ring was increased to about 90° C. under the condition A (Comparative Example indicated by a solid line in the figure). In contrast, the temperature of the focus ring was in a range of about 75 to 80° C. under the condition B (the vacuum evacuation step and the pressure restoration step were performed one time as indicated by a broken line in the figure) and the temperature of the focus ring was decreased to the range of about 60 to 65° C. under the condition C (the vacuum evacuation step and the pressure restoration step were performed two times as indicated by a dot line in the figure).

It was confirmed in these measurement results that the method in accordance with the embodiment of the present invention is particularly effective in improving the heat transfer from the focus ring to the wafer chuck. Apparently, it is more effective to perform the vacuum evacuation step and the pressure restoration step two times than to perform them one time.

TEST EXAMPLE 2

Investigation as to whether the long-time vacuum evacuation was effective was conducted by measuring the temperature of the focus ring under the following three conditions:

Condition D: the vacuum evacuation step and the pressure restoration step were not performed (Comparative Example 1);

Condition E: the vacuum evacuation step (to one Torr or less) was performed for twelve hours and the pressure restoration step was not performed (Comparative Example 2); and Condition F: the vacuum evacuation step (to one Torr or less) was performed for twelve hours and the atmospheric pressure restoration step was performed twice (Present Example 3).

Figure 4:
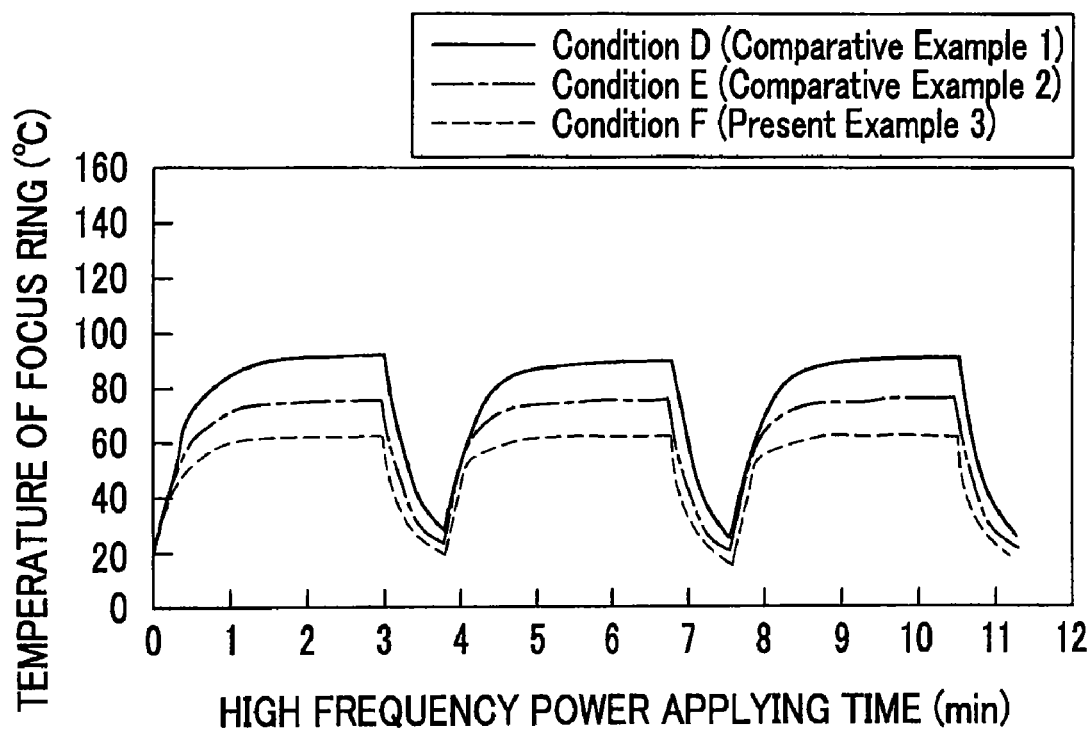
FIG. 4 is a view illustrating another example of measurement results of a focus ring temperature in the embodiment of the present invention.
Figure 5:
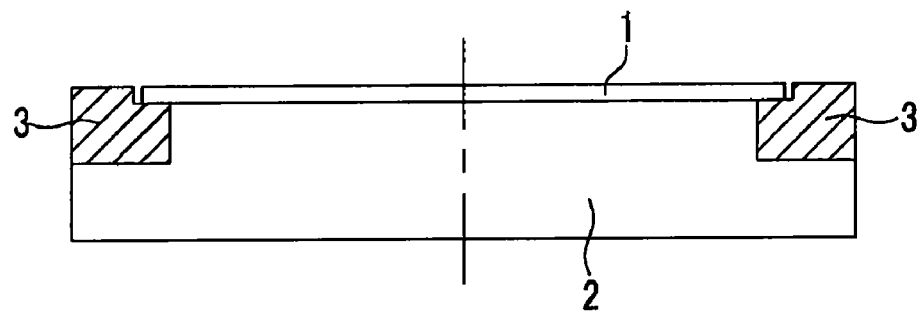
FIG. 5 is an explanatory view showing a configuration of the prior art semiconductor substrate mounting device.

The measurement results of focus ring temperature under these conditions are shown in FIG. 4. The average focus ring temperature (the average value of three measured temperatures) under the condition D was as high as 90.4° C. In contrast, the average focus ring temperatures under the conditions E and F were 75.2° C. and 63.2° C., respectively.

It can be seen in these measurement results that the heat transfer improving effect is not so great even if the vacuum evacuation to one Torr or less is performed for a long period of time reaching twelve hours. This means that provision of the pressure restoration step has a greater effect to improve the adhesity of the heat transfer sheet.

While the invention has been shown and described with respect to the preferred embodiments, it will be understood by those skilled in the art that various changes and modifications may be made without departing from the scope of the invention as defined in the following claims.

What is claimed is:

1. A method for improving heat transfer of a focus ring arranged in an outer peripheral portion of a mounting surface of a mounting table, the mounting table adapted to mount a target substrate in a chamber, the method comprising:

disposing a heat transfer sheet between the focus ring and the mounting table; and vacuum-evacuating the chamber prior to processing the target substrate and then restoring the pressure inside the chamber to an atmospheric pressure or a slight vacuum pressure, whereby air present in a fine gap between the heat transfer sheet and the mounting surface is removed to allow the heat transfer sheet to adhere to the mounting surface, wherein said vacuum-evacuating the chamber and said restoring the pressure are repeatedly performed plural times.

2. The method of claim 1, wherein the vacuum evacuation is performed at a vacuum level of one Torr or less.

3. The method of claim 1, wherein the heat transfer sheet comprises a flexible high molecular material.

4. The method of claim 1, wherein the heat transfer sheet comprises a sheet made of or containing gel-like polymer, the sheet having a ratio of the hardness represented in terms of ASKER C to the heat transfer rate represented in terms of W/m·K smaller than 20.

5. The method of claim 4, wherein the heat transfer sheet is of a thickness of 0.2 to 1 mm.

\* \* \* \* \*